US007714346B2

United States Patent
Ogawa et al.

(10) Patent No.: US 7,714,346 B2
(45) Date of Patent: May 11, 2010

(54) SURFACE MOUNTING LED SUBSTRATE AND LED

(75) Inventors: Yoshihiro Ogawa, Tokyo (JP); Kazuhiko Ueno, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 114 days.

(21) Appl. No.: 11/463,116

(22) Filed: Aug. 8, 2006

(65) Prior Publication Data

US 2007/0063204 A1    Mar. 22, 2007

(30) Foreign Application Priority Data

Sep. 21, 2005    (JP)    ............................. 2005-274075

(51) Int. Cl.
*H01L 29/18* (2006.01)
*H01L 23/544* (2006.01)
*H01L 21/78* (2006.01)

(52) U.S. Cl. ........................ 257/99; 257/88; 257/100; 257/620; 257/E33.057; 257/E21.599

(58) Field of Classification Search ................. 257/88, 257/99, 100, 620, 678, 685, 723, 724, E33.056, 257/E33.057, E23.179, E21.532, E21.599
See application file for complete search history.

(56) References Cited

U.S. PATENT DOCUMENTS 6,281,435 B1 * 8/2001 Maekawa ................... 174/539

| 2002/0047130 A1 * | 4/2002 | Koay et al. ................. 257/99 |
| 2004/0079957 A1 * | 4/2004 | Andrews et al. ............ 257/100 |
| 2005/0151142 A1   | 7/2005 | Imai |
| 2007/0063209 A1 * | 3/2007 | Sugiura et al. ............. 257/98 |

FOREIGN PATENT DOCUMENTS

JP    2002-222997    8/2002

* cited by examiner

*Primary Examiner*—Anh Phung
*Assistant Examiner*—Allison P Bernstein
(74) *Attorney, Agent, or Firm*—Cermak Kenealy Vaidya & Nakajima LLP (57) ABSTRACT

An LED and a surface mounting LED substrate for use in production of multi-faced surface mounting LEDs can include a resist layer on a conductor pattern that runs from an LED chip-mounted upper surface along a side portion and to a lower surface of the LED substrate. The resist layer is formed at least at a portion that is folded and runs along the lower surface and across a cutting line for separating/dividing at least the multi-faced surface mounting LEDs into discrete surface mounting LEDs. The resist layer is configured to suppress a burr that sometimes develops at a section of the conductor pattern during cutting/dicing of the multi-faced surface mounting LED substrate.

16 Claims, 6 Drawing Sheets

SURFACE MOUNTING LED SUBSTRATE AND LED

This application claims the priority benefit under 35 U.S.C.§119 of Japanese Patent Application No. 2005-274075 filed on Sep. 21, 2005, which is hereby incorporated in its entirety by reference.

BACKGROUND

1. Technical Field

The disclosed subject matter relates to a surface mounting LED substrate and LED. More particularly, it relates to a surface mounting LED plate provided with means for preventing a burr from developing at a section of a conductor pattern contained in a substrate. A burr will sometimes develop when the LED substrate is cut with a dicing blade in a dicing step, which is one of the process steps for manufacturing a surface mounting LED.

2. Description of the Related Art

A surface mounting LED can be fabricated through the process outlined below. On a multi-faced substrate having conductor patterns formed on a surface thereof, multiple LED chips are die-bonded at a certain interval with an electrically conductive adhesive interposed therebetween. Further, wire bonding is applied to the die-bonded LED chips through the use of bonding wires. Thereafter, the LED chips and the bonding wires are covered and sealed in a sealing resin.

As a result, multiple surface mounting LEDs integrated with the substrate and the sealing resin and which are multi-faced are formed on the multi-faced substrate. A dicing blade is then used to simultaneously dice the substrate and the sealing resin at a certain interval to complete the discrete surface mounting LEDs.

The surface mounting LEDs that are completed through the above process steps have some problems and some areas for improvement. One such problem is made apparent when dicing the multi-faced substrate, due to the structure of the substrate.

The general structure of a substrate used in a typical surface mounting LED will now be described. An available base material serving as a base of the substrate may include an insulator, such as paper phenol, paper epoxy, glass epoxy and ceramic, and a metal, such as aluminum and iron. A copper foil is attached onto one or both surfaces of the base material and then undesired portions are removed from the copper foil by etching to leave desired portions to form conductor patterns that are composed of the copper foil.

In typical cases, copper, nickel and gold plating may be applied in turn onto the conductor pattern, as necessary. In particular, when wire bonding is applied to connect electrodes on the LED chips with the conductor patterns via bonding wires, plating is an effective means to reliably connect the bonding wires with both electrodes.

The multiple surface mounting LEDs formed on the multi-faced substrate as described above are diced with a dicing blade of a dicer. In this case, when the conductor pattern formed on the substrate is cut with the dicing blade, a burr may develop at a section of the conductor pattern.

When the surface mounting LEDs are mounted on a motherboard, the burr may protrude downward from the surface mounting LED and prevent the LED from keeping flat relative to the motherboard. As a result, the surface mounting LEDs are mounted in random directions and/or orientations, which can result in a lack of ability to be reliably reproduced and uniformly mounted.

As a result, the surface mounting LEDs mounted on the motherboard can not satisfy various optical properties required for the surface mounting LEDs and may not be reliably mounted. This is sometimes a factor in causing a reduction in yield due to a performance failure of the motherboard.

In order to suppress development of burrs or to eliminate development of burrs at the section of the conductor pattern when dicing the substrate, the following methods have been previously undertaken or proposed.

Figure 9A:
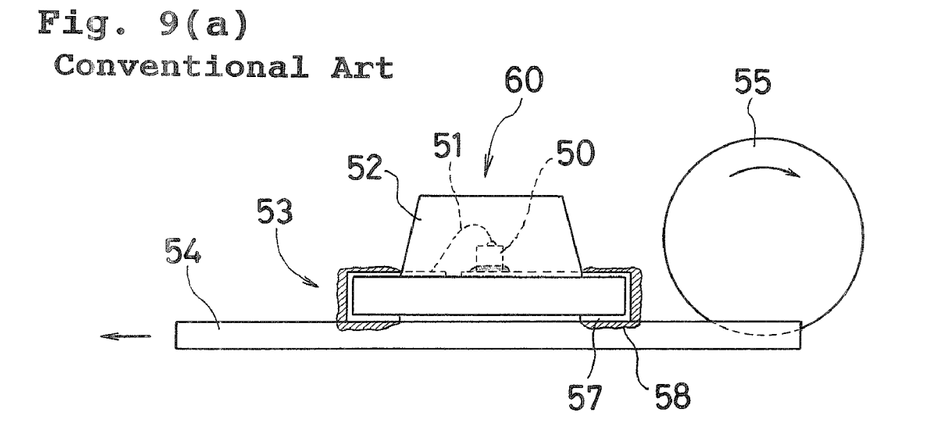
FIGS. 9a-c show side views illustrative of a method of dicing multi-faced surface mounting LEDs that use a substrate according to conventional art.

In the former case, a generally available method comprises die bonding and wire bonding a plurality of LED chips 50 with bonding wires 51 as shown in FIG. 9A. The LED chips 50 and the bonding wires 51 are then sealed in a sealing resin 52 that is composed of a light transmissive resin to form a multi-faced substrate 53, which is set on a soft organic dicing sheet 54. A multi-faced surface mounting LED 60 that is movable with the organic dicing sheet 54 is directed to a dicing procedure in which the sealing resin 52 and the substrate 53 are simultaneously diced with a rotating dicing blade 55 from the sealing resin 52 toward the substrate 53.

This dicing method may not prevent a burr 58 from developing at a section of a conductor pattern 57 and extending downward from the substrate 53 because the dicing sheet 54 is soft. Accordingly, this method may not effectively suppress development of burrs.

Figure 9B:
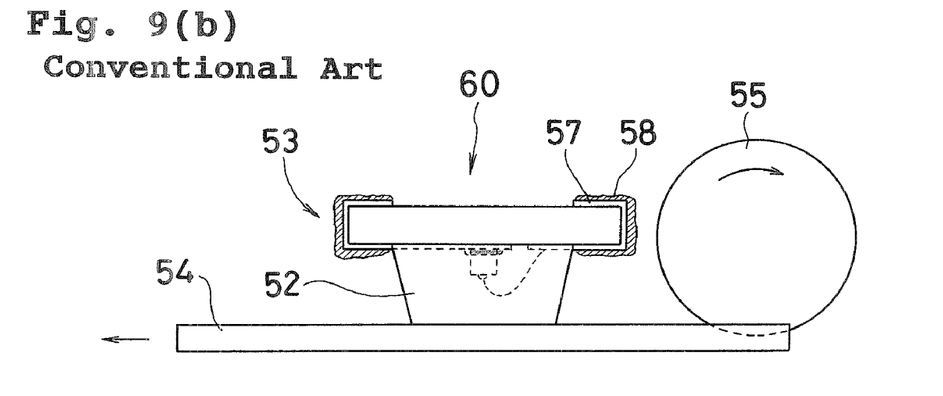

As shown in FIG. 9B, the upper surface of the sealing resin 52 is set on the soft organic dicing sheet 54 in another conventional operation. Then, the multi-faced surface mounting LED 60 that is attached/movable with the organic dicing sheet 54 is directed to a dicing operation in which the substrate 53 and the sealing resin 52 are simultaneously diced with the rotating dicing blade 55 from the substrate 53 toward the sealing resin 52.

This dicing method is possible to reduce the volume of a burr 58 that may develop at the section of the conductor pattern 57 and which extends downward from the substrate 53. In this orientation, however, the appearance of products can not be inspected and the sealing resin 52 set may possibly be peeled off on dicing under pressure and vibrations from the dicing blade 55.

Figure 9C:
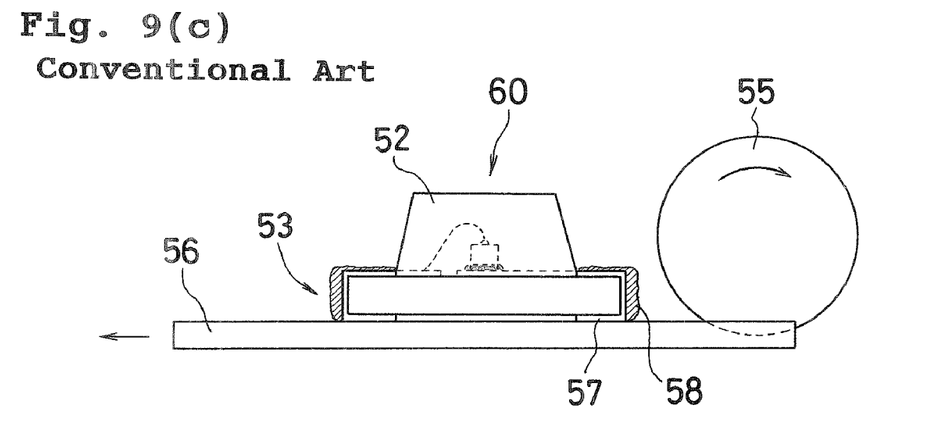

Further, in another conventional operation shown in FIG. 9C, the multi-faced substrate 53 is adhered on an almost flat surface of a plate of ice 56. Then, the multi-faced surface mounting LED 60 is moved with the almost flat ice 56 and directed to a dicing operation in which the sealing resin 52 and the substrate 53 are simultaneously diced with the dicing blade 55 rotating in a direction from the sealing resin 52 toward the substrate 53.

This dicing method makes it possible to prevent a burr 58 from developing at the section of the conductor pattern 57 and extending downward from the substrate 53 because the lower surface of the substrate 53 makes contact with a hard member (ice 56). This method, however, requires time for adhering (fixing) the substrate on the almost flat surface of the ice 56 and is difficult for use in mass production.

Figure 10:
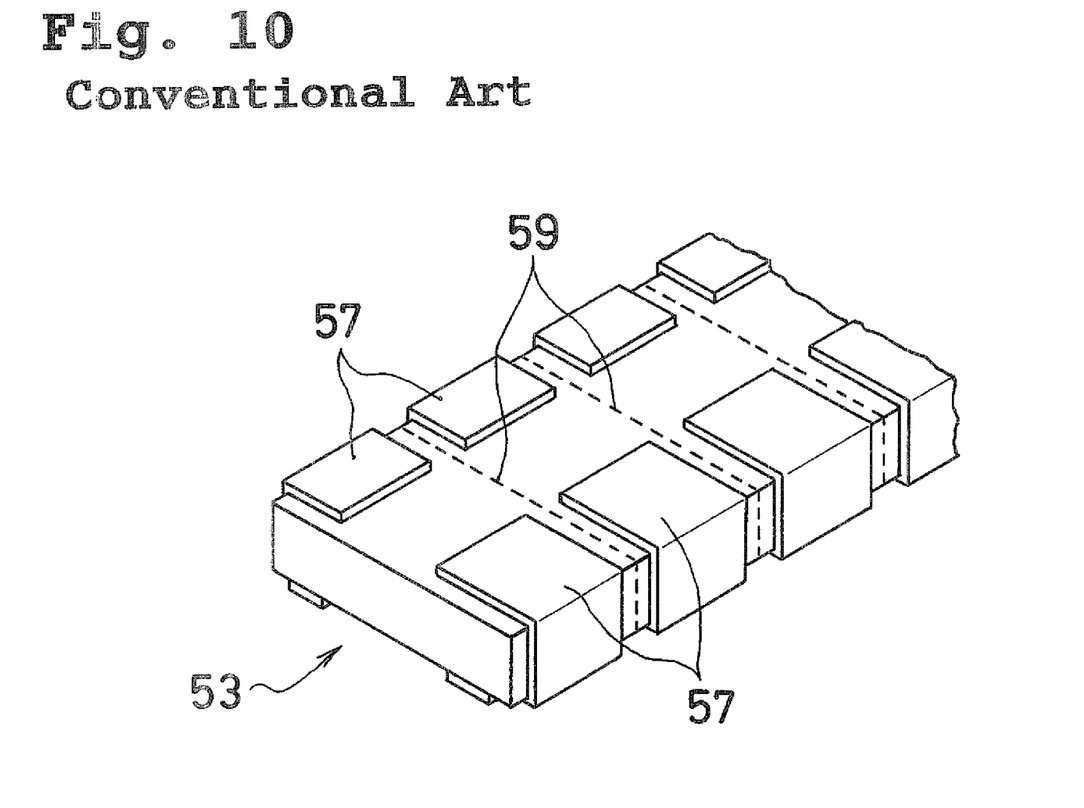
FIG. 10 is a perspective view of a lower surface illustrative of a substrate for surface mounting LEDs according to conventional art.

On the other hand, a method that allows no development of burrs during a dicing operation is shown in FIG. 10. This method involves the specific formation of the conductor pattern 57 on the lower surface of the substrate 53, which are the most troublesome portion of the conductor pattern associated with development of burrs. Portions of the conductor pattern located at least on a dicing line 59 are removed to allow dicing without cutting the conductor pattern. Japanese Patent publication JP-A 2002-222997 is a conventional art example of such a dicing method.

The method shown in FIG. 10 requires that a portion of the conductor pattern be removed, the removed portion having a width larger than the dicing width (the thickness of the dicing blade). As a result, the area of the conductor pattern formed on the lower surface of the substrate for the surface mounting LED is reduced and lowers the strength of the product against stress. In addition, when the product is mounted on a motherboard with an electrically conductive member interposed therebetween, the small area of the conductor pattern serving as a bonding electrode on the product results in a reduction in fixing force against a lateral weight.

SUMMARY OF THE DISCLOSED SUBJECT MATTER

The disclosed subject matter has been made in consideration of the above described and other problems and considerations, and includes a surface mounting LED substrate configured to be multi-faced and include a plurality of LEDs mounted on a multi-faced substrate and integrated with a sealing resin. The multi-faced surface mounting LEDs are separated/divided with a dicing blade of a dicer into discrete surface mounting LEDs. Development of burrs can be reduced without the need for departing significantly from conventional processing. In addition, production costs can be maintained or reduced, and productivity can be maintained or increased.

In accordance with a first aspect of the disclosed subject matter, a surface mounting LED substrate for use in production of multi-faced surface mounting LEDs can include a plurality of LED chips mounted thereon at a certain interval and sealed in a sealing resin. The surface mounting LED substrate can include a conductor pattern formed thereon running from an LED chip-mounted upper surface through a side to a lower surface. A resist layer can be formed at least on the conductor pattern that is folded over to the lower surface and across a cutting line for separating/dividing the multi-faced surface mounting LEDs into discrete surface mounting LEDs.

In accordance with another aspect of the disclosed subject matter, gold plating can be applied to portions other than those portions of the conductor pattern that have the resist layer formed thereon.

In accordance with another aspect of the disclosed subject matter, an LED semiconductor device can include a substrate having a top surface and a bottom surface connected by side surfaces. A conductor pattern can include a top portion located adjacent the top surface of the substrate and a bottom portion located adjacent the bottom surface of the substrate. At least one LED chip can be located adjacent the top portion of the conductor pattern, and at least one resist layer can be located adjacent the bottom portion of the conductor pattern.

The surface mounting LED substrate for use in production of multi-faced surface mounting LEDs can include a resist layer on a portion or portions of a conductor pattern that runs from an LED chip-mounted upper surface through a side and to a lower surface. The resist layer can be formed at least at a portion that is folded to the lower surface and across a cutting line for separating/dividing the multi-faced surface mounting LEDs into discrete surface mounting LEDs.

Accordingly, burrs that may otherwise develop at a section of the conductor pattern can be suppressed under the resist layer and be prevented from externally protruding through the resist layer.

As a result, when surface mounting LEDs that use the surface mounting LED substrate of the presently disclosed subject matter are mounted on a motherboard, they can be mounted reliably on a mounting surface of the motherboard and in a stable state. Therefore, the surface mounting LEDs mounted on the motherboard can exhibit reproducible, stable optical properties and achieve reliability on mounting, playing part of a role to ensure the motherboard yield.

Multi-faced surface mounting LEDs including a plurality of LEDs mounted on a multi-faced substrate and integrated with a sealing resin can be separated/divided with a dicing blade of a dicer into discrete surface mounting LEDs. In this case, development of burrs can be reduced without the need for changing the conventional dicing process steps. In addition, production cost can be contained or reduced, and increased mass productivity can be achieved.

DETAILED DESCRIPTION OF THE DISCLOSED SUBJECT MATTER

Exemplary embodiments of the disclosed subject matter will now be described in detail with reference to FIGS. 1-6 and 8 (with the same reference numerals denoting the same or similar parts). The embodiments described below are only examples of the presently disclosed subject matter, and are accordingly given various technical features. However, the scope of the invention should not be considered to be limited to these embodiments.

Figure 1:
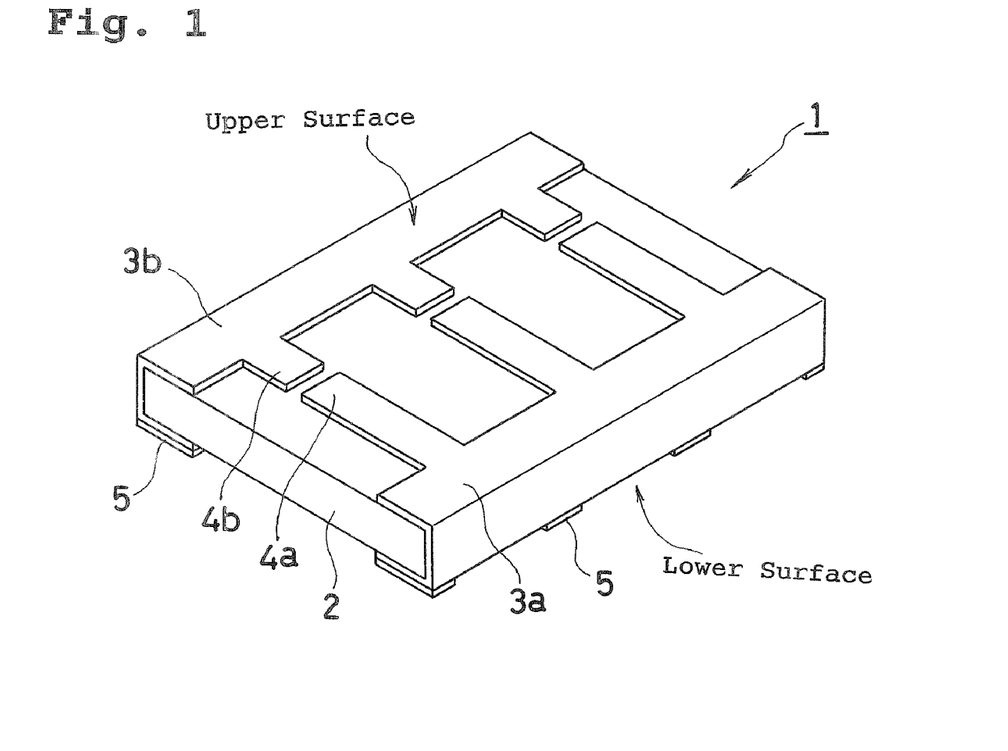
FIG. 1 is a perspective view seen from the upper surface illustrative of an embodiment of a substrate for surface mounting LEDs made in accordance with principles of the disclosed subject matter.
Figure 2:
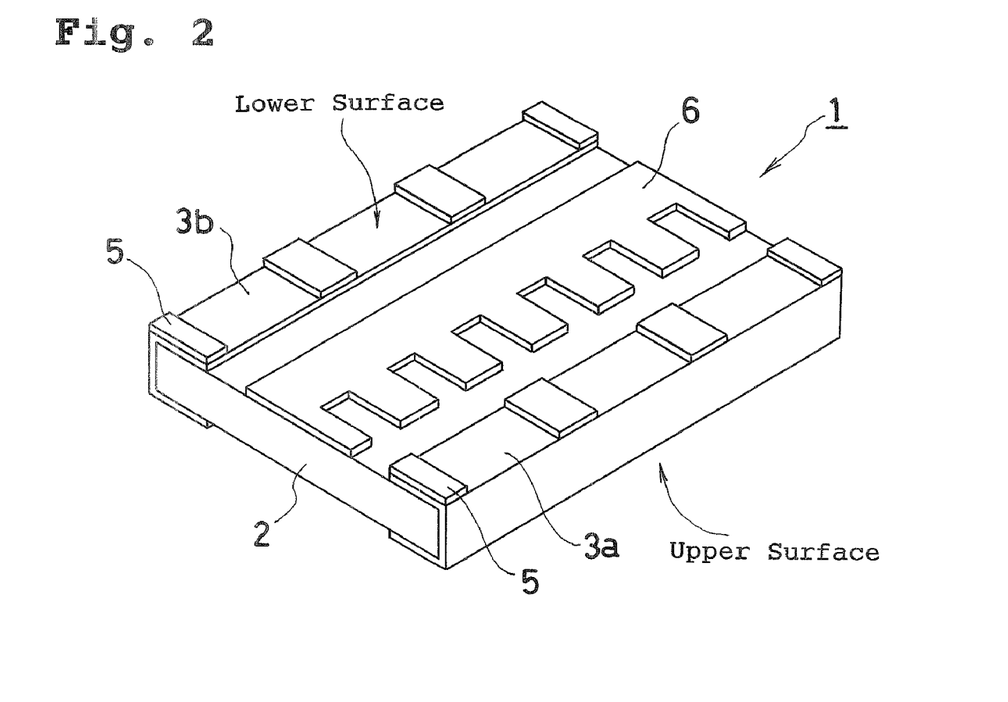
FIG. 2 is a perspective view seen from the lower surface illustrative of an embodiment of a substrate for surface mounting LEDs made in accordance with principles of the disclosed subject matter.

FIGS. 1 and 2 are perspective views illustrative of an embodiment of a surface mounting LED substrate (hereinafter referred to as an "LED substrate" in abbreviation) made in accordance with principles of the disclosed subject matter.

FIG. 1 shows an LED chip-mounted side and FIG. 2 shows the side opposite to the LED chip-mounted side.

The LED substrate 1 can include a pair of conductor patterns 3a, 3b formed on an upper surface (the LED chip-mounted side) of a base material 2 and at both opposite side edges. The conductor patterns 3a, 3b each extend from the edge of the base material 2 along or through a side to a lower surface (the side opposite to the LED chip-mounted side).

As described in the background, the base material 2 may include an insulator, such as paper phenol, paper epoxy, glass epoxy and ceramic, and a metal, such as aluminum and iron. When a metal material is used, it may be helpful to provide an insulating layer between the base material and the conductor pattern to prevent both from short-circuiting.

The paired conductor patterns 3a, 3b formed on the upper surface of the base material 2 at both opposite edges include respective extensions of the conductor patterns 3a, 3b that are provided at certain intervals. The extensions extend inwardly on the LED substrate 1 and are opposed to each other to form die bonding pads 4a and wire bonding pads 4b.

On the other hand, the portion of the conductor patterns 3a, 3b that are folded to the lower surface of the base material 2 can include a resist film 5 formed to at least partially cover the conductor patterns 3a, 3b. In this case, the portion provided with the resist film 5 thereon corresponds at least to the position subjected to dicing with a dicing blade of a dicer. Dicing is executed when a number of multi-faced surface mounting LEDs (hereinafter referred to as "LEDs" in abbreviation) that are integrally fabricated on the multi-faced LED substrate are separated/divided into discrete LEDs during the dicing process step.

Exposed portions of the conductor patterns 3a, 3b (i.e., those portions not covered with the resist film 5) can be subjected to application of copper, nickel and gold plating in turn, if desired. This application may be helpful in certain die bonding and wire bonding processes, and in soldering the LED motherboard such that these processes can be executed with certainty and with high reliability.

A polarity mark 6 composed of an insulating material can be provided on the base material 2 at a position sandwiched between the paired conductor patterns 3a, 3b that are folded to the lower surface of the base material 2. The polarity mark 6 plays a role in indicating the polarities of the conductor patterns 3a and 3b.

Figure 3:
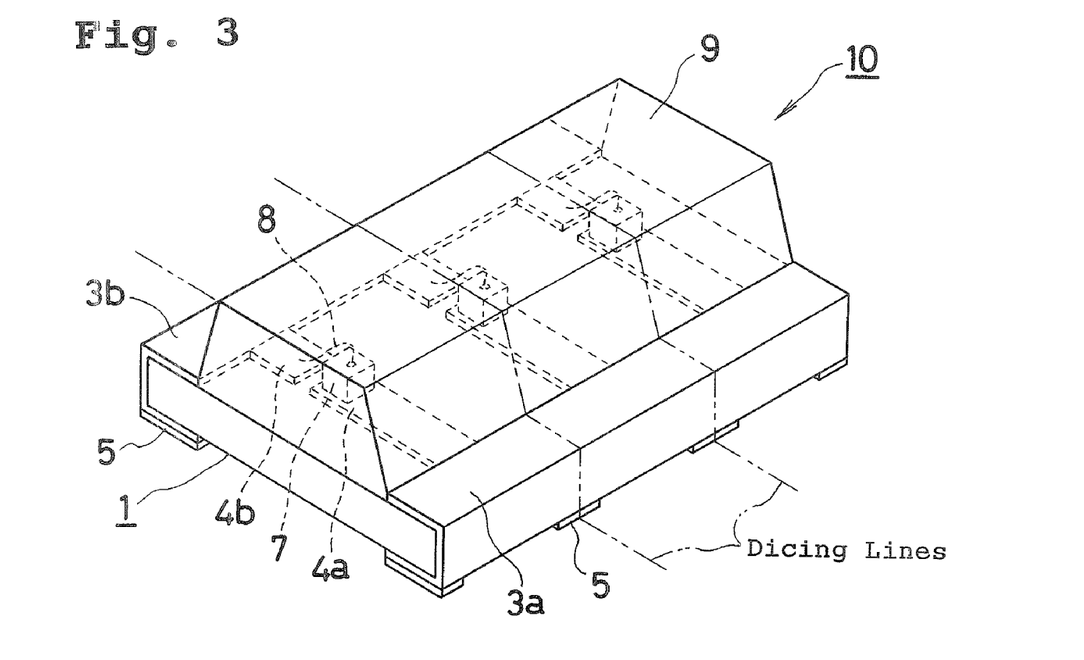
FIG. 3 is a perspective view of an upper surface illustrative of an embodiment of a substrate with multi-faced surface mounting LEDs made in accordance with principles of the disclosed subject matter.
Figure 4:
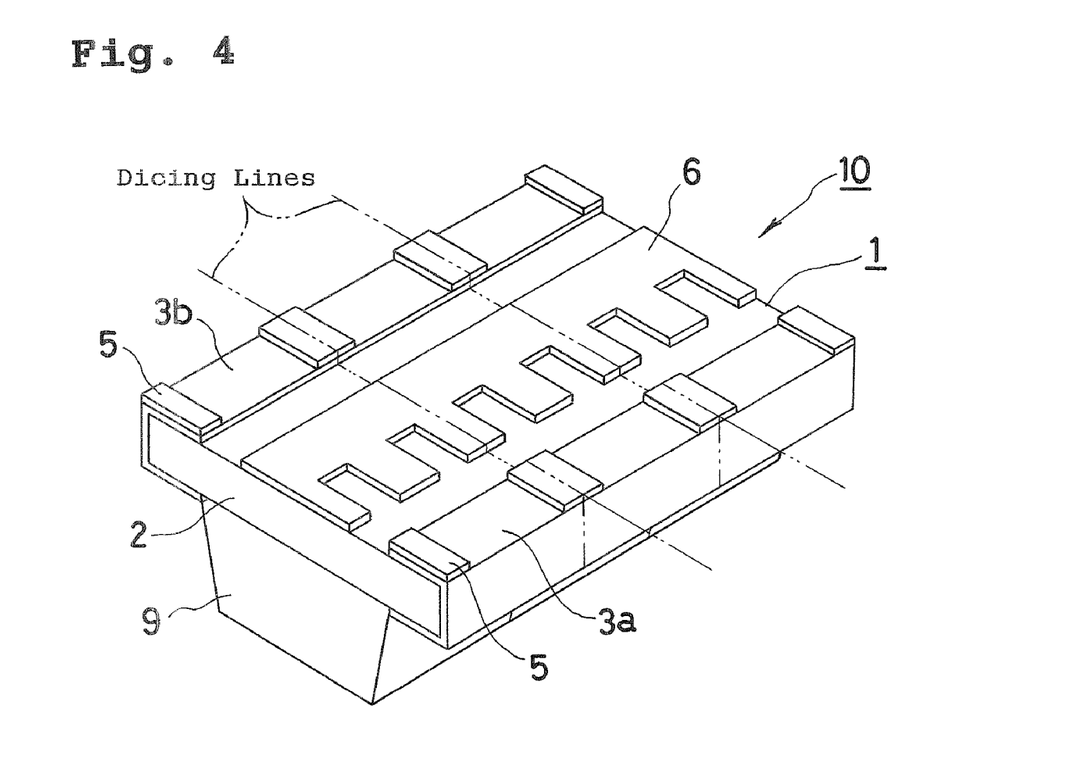
FIG. 4 is a perspective view of a lower surface illustrative of a substrate with multi-faced surface mounting LEDs made in accordance with principles of the disclosed subject matter.

Multiple LED chips are mounted on a multi-faced LED substrate that is configured as described above, and a sealing resin composed of a light transmissive resin can be used to create a multiple number of LEDs that, at this point in production, are integrally formed, as shown in FIGS. 3 and 4. FIG. 3 is a perspective view of the LED chip-mounted side of the substrate, and FIG. 4 is a perspective view of the side opposite the LED chip-mounted side.

LED chips 7 can be mounted on the die bonding pads 4a of the multi-faced LED substrate 1 with an electrically conductive adhesive (not shown). The adhesive can be configured to electrically connect lower electrodes of the LED chips 7 with the conductor pattern 3a. Upper electrodes on the LED chips 7 can be electrically connected with wire bonding pads 4b via bonding wires 8 to electrically connect the upper electrodes on the LED chips 7 with the conductor pattern 3b.

The multiple LED chips 7 mounted on the multi-faced LED substrate 1 and the multiple bonding wires 8 can be integrally covered and sealed in the sealing resin 9. The sealing resin protects the LED chips 7 from external environments such as moisture, dirt and gases and protects the bonding wires 8 from mechanical stresses such as vibrations and impacts. The sealing resin 9 forms an interface with the light exit surface of the LED chip 7, which can function to efficiently lead the light emitted from the LED chip 7 through the light exit surface of the LED chip 7 into the sealing resin 9.

Figure 5:
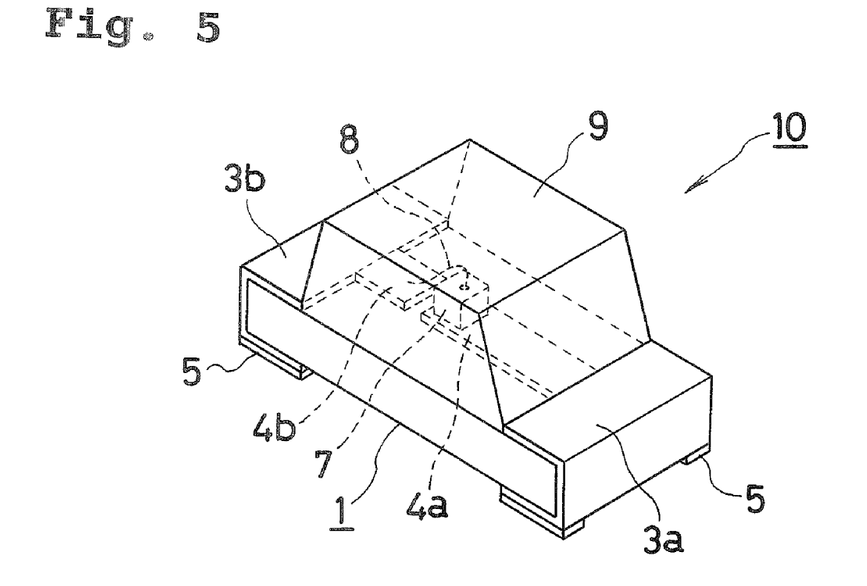
FIG. 5 is a perspective view of an upper surface illustrative of an embodiment of a surface mounting LED made in accordance with principles of the disclosed subject matter.
Figure 6:
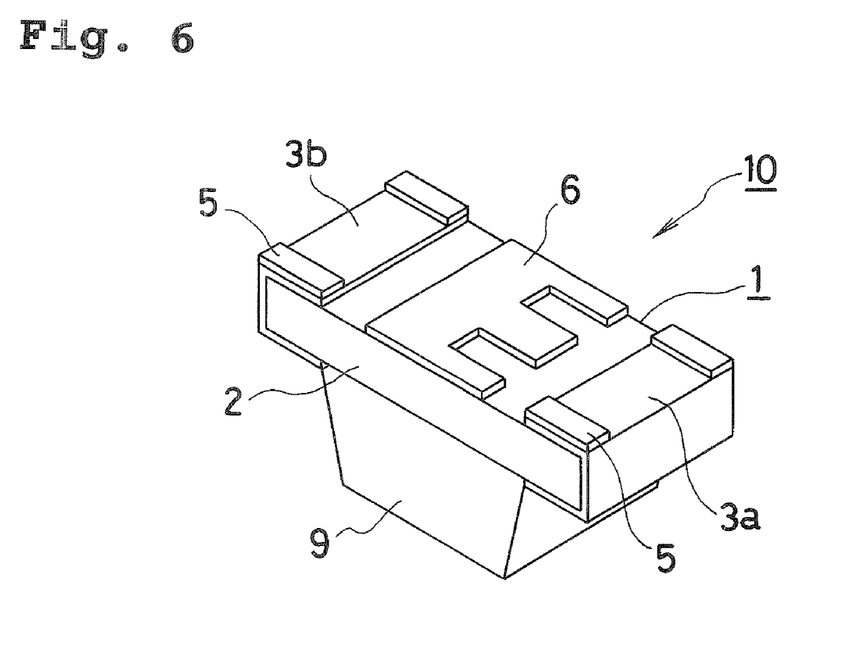
FIG. 6 is a perspective view of a lower surface illustrative of an embodiment of a surface mounting LED made in accordance with principles of the disclosed subject matter.

When the multi-faced LEDs 10 are subjected to dicing along dicing lines, they are separated/divided into discrete LEDs, each as shown in FIGS. 5 and 6. FIG. 5 is a perspective view of an LED chip-mounted side of the discrete LED, and FIG. 6 is a perspective view of the side opposite the LED chip-mounted side of the discrete LED.

The structures of the LED shown in FIGS. 5 and 6 have been described in sufficient detail above with respect to the description for the multi-faced LED substrate shown in FIGS. 1 and 2 and the multi-faced LEDs shown in FIGS. 3 and 4, respectively. Therefore, a duplicative detailed description will be omitted from the following description.

Figure 7A:
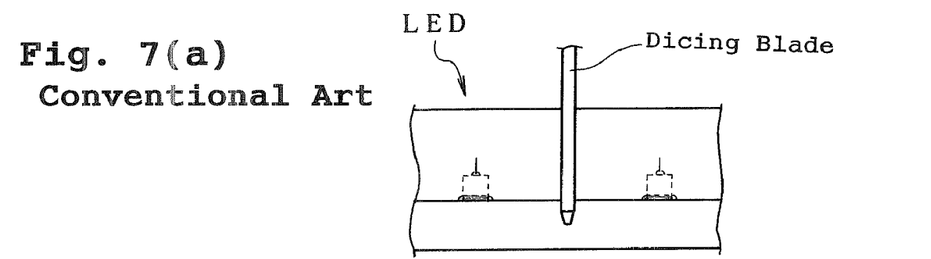
FIGS. 7a-b show front views illustrative of multi-faced surface mounting LEDs using a substrate for surface mounting LEDs in accordance with the conventional art under dicing conditions.
Figure 7B:
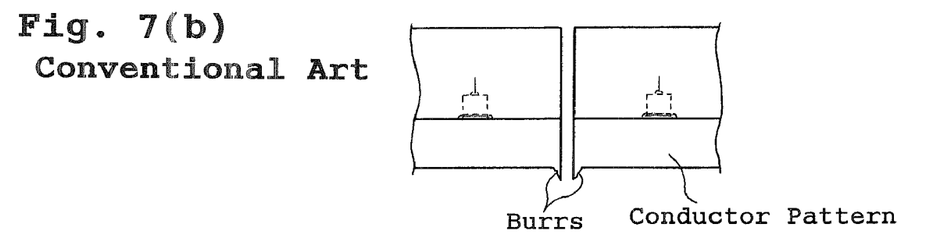

When the conventional multi-faced LEDs shown in FIG. 7A are subjected to dicing with a dicing blade of a dicer, burrs may develop at a section of the conductor pattern. In particular, burrs may develop at the section of the conductor pattern that is folded to the lower surface of the LED, and may include burrs extending downward, as shown in FIG. 7B. Such burrs become a factor during production because they tend to float the LED above the motherboard when the LED is mounted on the motherboard, and prevent the LED from keeping relative flatness with respect to the motherboard. As a result, the LEDs are mounted in random directions and are not reliably reproducible or uniform. Therefore, reliable mounting is prevented.

As a result, the LEDs mounted on the motherboard can not satisfy various optical properties required for the LEDs and may not be reliably mounted. Accordingly, a reduction in yield may occur due to performance failure of the motherboard.

Figure 8A:
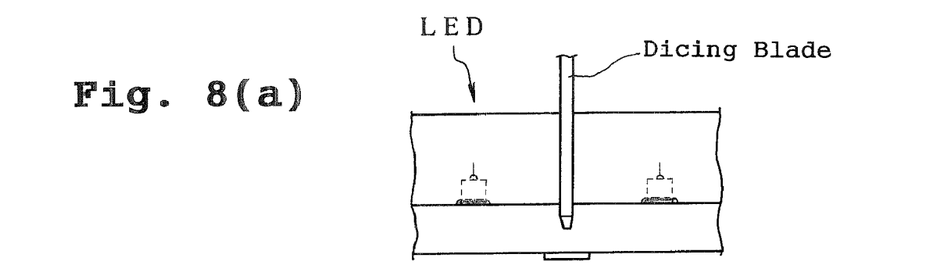
FIGS. 8a-b show front views illustrative of multi-faced surface mounting LEDs using a substrate for surface mounting LEDs made in accordance with principles of the disclosed subject matter under dicing conditions.
Figure 8B:
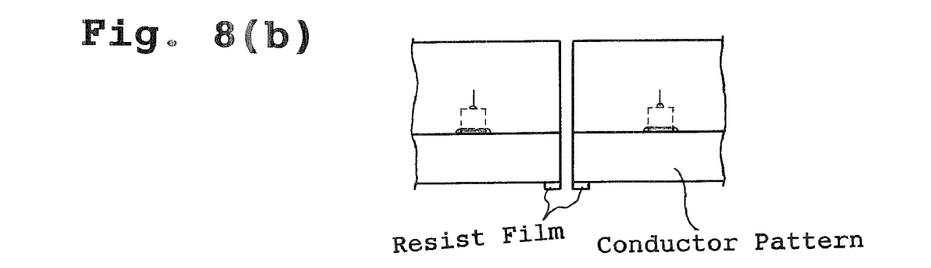

To the contrary, in the surface mounting LED substrate of the presently disclosed subject matter, at least on the conductor pattern that is folded to the lower surface of the multi-faced LEDs and at the portion that is to be cut during dicing, a resist film can be formed to cover a portion or portions of the conductor pattern. Therefore, when the multi-faced LEDs are diced with the dicing blade of the dicer as shown in FIG. 8A, burrs of the conductor pattern can be prevented from externally protruding through the resist film because the burrs are pressed down under the resist film that covers the conductor pattern.

Therefore, when the LEDs that use the surface mounting LED substrate described above are mounted on a motherboard, they can be mounted flat and reliably on a mounting surface of the motherboard. As a result, the LEDs mounted on the motherboard can exhibit reproducible, stable optical properties and achieve reliability upon mounting, thus playing a part in ensuring the motherboard yield.

The portion of the conductor pattern with the resist film formed thereon may not be subjected to application of nickel and gold plating. Therefore, that portion of the conductor pattern has a thickness that is thinner than those of other portions and can suppress the height of burrs that are developed at these sections. In addition, the burrs developed can be pressed down under the resist film. Thus, the suppression of burrs with the resist film can be made more reliable.

When the multiple LEDs mounted on the multi-faced substrate that are integrated with the sealing resin are separated/divided with the dicing blade of the dicer into discrete surface mounting LEDs, development of burrs can be reduced without the need for changing the conventional dicing process steps, and production cost can be kept low while maintaining mass productivity While there has been described what are at present considered to be exemplary embodiments of the disclosed subject matter, it will be understood that various modifications may be made thereto, and it is intended that the appended claims cover such modifications as fall within the true spirit and scope of the disclosed subject matter. All conventional art references described above are herein incorporated in their entirety by reference.

What is claimed is:

1. A surface mounting LED substrate for use in production of multi-faced surface mounting LEDs and including a plurality of LED chips adjacent the substrate at a certain interval and sealed in a sealing resin, the surface mounting LED substrate comprising:

a substrate layer having an LED chip mounting upper surface, a lower surface spaced from the LED chip mounting upper surface, and a first side surface extending from the LED chip mounting upper surface to the lower surface, and the substrate layer has a first substrate edge located between the first side surface and the lower surface;

a conductor pattern having an upper portion formed adjacent to the LED chip mounting upper surface, a lower portion formed adjacent the lower surface, and a side portion, the lower portion includes an underside surface that faces away from the lower surface of the substrate and the side portion is formed adjacent to the first side surface and extends from the upper portion to the lower portion, and the side portion includes an outer surface, and the conductor pattern has a first conductor edge located between the underside surface of the lower portion and the outer surface of the side portion and located along with the first substrate edge; and a resist layer formed on the underside surface of the lower portion of the conductor pattern and formed to reach the first conductor edge to form a side surface of the resist layer such that the first conductor edge, the first substrate edge, and the side surface of the resist layer are substantially coplanar.

2. The surface mounting LED substrate according to claim 1, further comprising:

gold plating applied to a portion of the conductor pattern other than the portion of the conductor pattern with the resist layer formed thereon.

3. The surface mounting LED substrate according to claim 1, wherein the conductor pattern includes a plurality of die bonding pads located on the LED mounting upper surface of the substrate layer and a plurality of wire bonding pads located on the LED mounting upper surface of the substrate layer, and the resist layer is located such that a plane that is perpendicular to the LED mounting upper surface and located between consecutive wire bonding pads intersects the resist layer.

4. The surface mounting LED substrate according to claim 1, further comprising:

a plurality of LED chips located on the conductor pattern.

5. The surface mounting LED substrate according to claim 4, further comprising:

a sealing resin located adjacent the plurality of LED chips.

6. The surface mounting LED substrate according to claim 1, wherein the resist layer includes a plurality of discrete resist layer portions located at spaced intervals along the conductor edge and adjacent the lower surface of the substrate layer.

7. The surface mounting LED substrate according to claim 1, wherein the resist layer is formed along the conductor edge at least at locations located between the consecutive LED chips along a longitudinal axis direction of the LED substrate.

8. An LED semiconductor device, comprising:

a substrate having a top surface and a bottom surface connected by side surfaces, and the substrate has a substrate edge lying between the bottom surface and one of the side surfaces;

a conductor pattern having a top portion located adjacent the top surface of the substrate and a bottom portion located adjacent the bottom surface of the substrate, the bottom portion includes an underside surface, wherein the bottom portion has a conductor pattern side surface overlying a first portion of the substrate edge and not overlying a second portion of the substrate edge, and the conductor pattern includes a conductor edge which lies between the conductor pattern side surface and the underside surface of the bottom portion;

at least one LED chip located adjacent the top portion of the conductor pattern; and at least one resist layer located on the underside surface of the bottom portion of the conductor pattern and formed to reach the conductor edge to form a side surface of the resist layer such that the conductor edge, the substrate edge, and the side surface of the resist layer are substantially coplanar.

9. The LED semiconductor device according to claim 8, wherein the at least one resist layer is located adjacent both the conductor edge and at least one of the side surfaces of the substrate.

10. The LED semiconductor device according to claim 8, wherein the substrate includes a first dice cut side that extends from the upper surface of the substrate to the lower surface of the substrate and the first dice cut side abuts the substrate lower surface to define a second substrate edge, and a second dice cut side that is opposed to the first dice cut side and extends from the upper surface of the substrate to the lower surface of the substrate and the second dice cut side abuts the substrate lower surface to define a third substrate edge, and the at least one resist layer includes a first portion that extends along the second substrate edge.

11. The LED semiconductor device according to claim 10, wherein the at least one resist layer includes a second portion that extends along the third substrate edge.

12. The LED semiconductor device according to claim 11, wherein the at least one resist layer includes a third portion that extends along the second substrate edge and a fourth portion that extends along the third substrate edge, the first, second, third, and fourth portions of the resist layer all being spaced from each other.

13. The LED semiconductor device according to claim 12, wherein each of the first, second, third, and fourth portions of the resist layer is located at a respective opposing corner of the lower surface of the substrate.

14. An LED semiconductor device, comprising:

a substrate having a top surface and a bottom surface connected by side surfaces;

a conductor pattern having a top portion located adjacent the top surface of the substrate and a bottom portion located adjacent the bottom surface of the substrate, the bottom portion includes an underside facing away from the bottom surface and a side surface adjacent to one of the side surfaces of the substrate;

at least one LED chip located adjacent the top portion of the conductor pattern; and at least one resist layer located on the underside of the bottom portion of the conductor pattern and including a side surface adjacent to the side surface of the conductor pattern, a diced surface including the one of the side surfaces of the substrate, the side surface of the bottom portion of the conductor pattern, and the side surface of the resist layer.

15. A surface mounting LED substrate for use in production of multi-faced surface mounting LEDs and including a plurality of LED chips adjacent the substrate at a certain interval and sealed in a sealing resin, the surface mounting LED substrate comprising:

a substrate layer having an LED chip mounting upper surface, a side surface and a lower surface, and the lower surface spaced from the LED chip mounting upper surface;

a conductor pattern having an upper portion located adjacent to the LED chip mounting upper surface, a side surface, and a lower portion located adjacent the lower surface, the lower portion including an underside; and a resist layer located on the underside of the lower portion of the conductor pattern and covering a portion of the conductor pattern located on a predetermined diced line, the resist layer having a side surface that is flush with the side surface of the substrate layer and the side surface of the conductor pattern.

16. An LED semiconductor device, comprising:

a substrate having a top surface and a bottom surface connected by side surfaces;

a conductor pattern having a top portion located adjacent the top surface of the substrate and a bottom portion located adjacent the bottom surface of the substrate, the bottom portion includes a side surface and an underside facing away from the bottom surface;

at least one LED chip located adjacent the top portion of the conductor pattern; and at least one resist layer located on the underside of the bottom portion of the conductor pattern and including a side surface;

wherein the side surface of the bottom portion of the conductor pattern and the side surface of the resist layer are flush with the one of the side surfaces of the substrate.

* * * * *